US007923727B2

(12) United States Patent
Misawa

(10) Patent No.: US 7,923,727 B2
(45) Date of Patent: Apr. 12, 2011

(54) IMAGE SENSOR INCLUDING A PHOTOELECTRIC CONVERSION FILM

(75) Inventor: Kaori Misawa, Kaizu (JP)

(73) Assignee: Sanyo Electric Co., Ltd., Osaka (JP)

( * ) Notice: Subject to any disclaimer, the term of this patent is extended or adjusted under 35 U.S.C. 154(b) by 987 days.

(21) Appl. No.: 11/754,594

(22) Filed: May 29, 2007

(65) Prior Publication Data

US 2007/0279661 A1 Dec. 6, 2007

(30) Foreign Application Priority Data

May 31, 2006 (JP) ................................. 2006-150789

(51) Int. Cl.
*H01L 27/14* (2006.01)

(52) U.S. Cl. ...................... 257/59; 257/292; 257/E27.13

(58) Field of Classification Search .................... 257/59, 257/292, E27.13, E31.091
See application file for complete search history.

(56) References Cited

U.S. PATENT DOCUMENTS 4,364,973 A * 12/1982 Koike et al. ..................... 427/75
2002/0056810 A1 * 5/2002 Kobayashi et al. ...... 250/370.09

FOREIGN PATENT DOCUMENTS

JP        2509592         4/1996

* cited by examiner

*Primary Examiner* — Thomas L Dickey
(74) *Attorney, Agent, or Firm* — Ditthavong Mori & Steiner, P.C.

(57) ABSTRACT

This image sensor comprises a plurality of pixel electrodes, a photoelectric conversion film arranged on the plurality of pixel electrodes, a dummy electrode formed on an end of the photoelectric conversion film for ejecting charges generated in the vicinity of the end of the photoelectric conversion film and a first transistor for controlling ejection of charges flowing into the dummy electrode.

18 Claims, 16 Drawing Sheets

IMAGE SENSOR INCLUDING A PHOTOELECTRIC CONVERSION FILM

BACKGROUND OF THE INVENTION

1. Field of the Invention

The present invention relates to an image sensor, and more particularly, it relates to an image sensor including a photoelectric conversion film.

2. Description of the Background Art

A stacked image sensor formed by stacking a photoelectric conversion film on pixel electrodes is known in general. For example, known is a CCD image sensor chip (image sensor) comprising pixel electrodes, dummy electrodes formed adjacently to endmost pixel electrodes and a photoconductor film (photoelectric conversion film) arranged on the pixel electrodes and the dummy electrodes. In this CCD image sensor chip, a positive potential is applied to the dummy electrodes for pouring and ejecting charges generated from the photoconductor film outside the endmost pixel electrodes into the dummy electrodes thereby inhibiting the charges generated outside the endmost pixel electrodes from flowing into the endmost pixel electrodes. Thus, endmost pixels corresponding to the endmost pixel electrodes are inhibited from reaching excessively bright levels due to increased signal charges therein.

In the conventional CCD image sensor chip, however, the positive potential is so regularly applied to the dummy electrodes that parts of charges generated in the vicinity of the boundaries between the dummy electrodes and the endmost pixel electrodes to originally flow into the endmost pixel electrodes disadvantageously flow into the dummy electrodes. Therefore, the quantities of the signal charges in the endmost pixels corresponding to the endmost pixel electrodes are so reduced that the endmost pixels are recognized darker than the actual levels. Thus, it is difficult to correctly control the signal charges flowing into the endmost pixel electrodes in the conventional CCD image sensor chip.

SUMMARY OF THE INVENTION

An image sensor according to an aspect of the present invention comprises a plurality of pixel electrodes, a photoelectric conversion film arranged on the plurality of pixel electrodes, a dummy electrode formed in the vicinity of an end of the photoelectric conversion film for ejecting charges generated in the vicinity of the end of the photoelectric conversion film and a first transistor for controlling ejection of charges flowing into the dummy electrode. The charges generated in the vicinity of the end of the photoelectric conversion film are those generated between the end of the photoelectric conversion film and ends of the plurality of pixel electrodes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, the structure of a CMOS image sensor 100 according to a first embodiment of the present invention is described with reference to FIGS. 1 and 2. According to the first embodiment, the present invention is applied to the CMOS image sensor 100, which is an exemplary image sensor.

Figure 1:
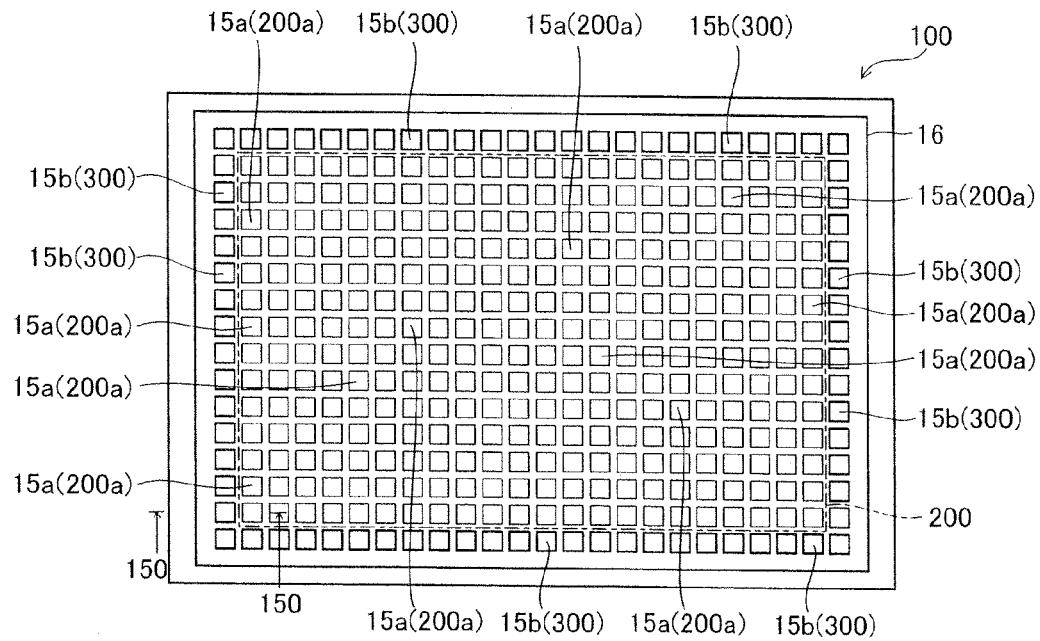
FIG. 1 is a plan view showing the overall structure of a CMOS image sensor according to a first embodiment of the present invention.
Figure 2:
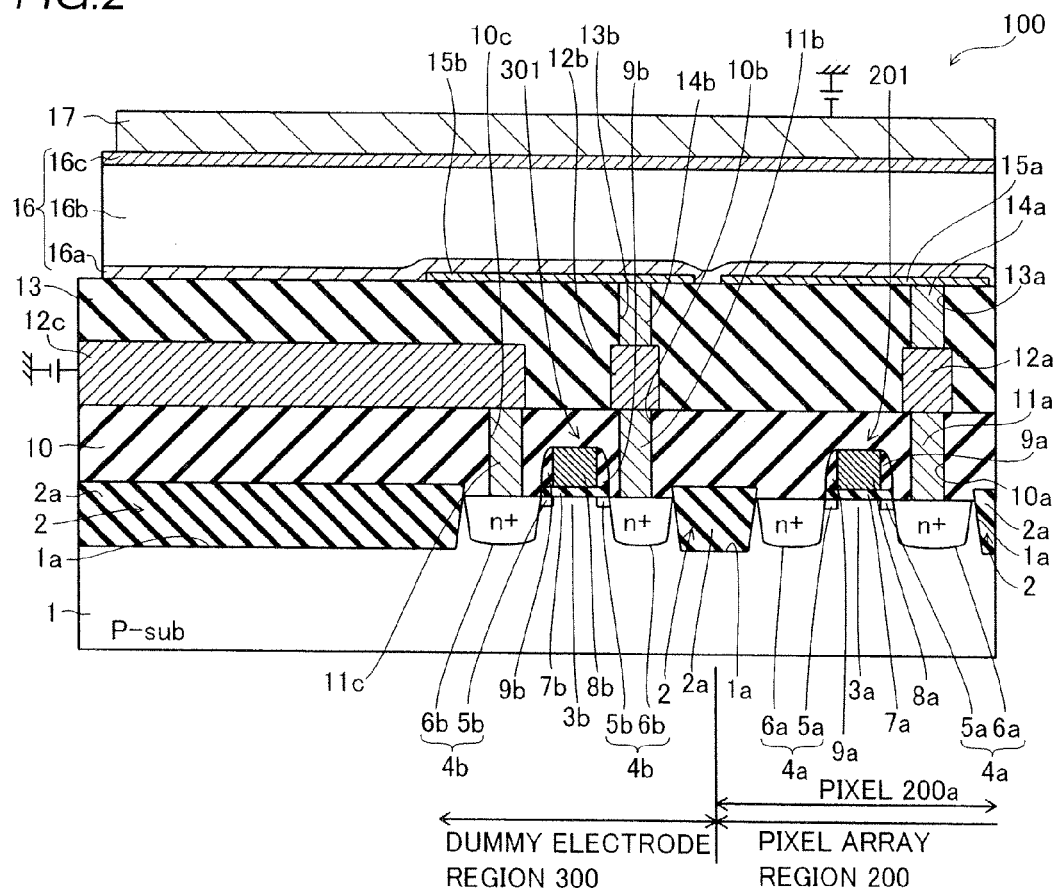
FIG. 2 is a sectional view taken along the line 150-150 in FIG. 1.

The CMOS image sensor 100 according to the first embodiment comprises a pixel array region 200 in which a plurality of pixels 200a are arranged in the form of a matrix and a plurality of dummy electrode regions 300 arranged at a prescribed interval to enclose the pixel array region 200, as shown in FIGS. 1 and 2. Pixel electrodes 15a having a rectangular (square) shape in plan view are formed on the pixels 200a of the pixel array region 200 respectively. The dummy electrode regions 300 are formed outside the pixels 200a provided on the outermost periphery of the pixel array region 200 to be adjacent thereto at a prescribed interval. Dummy electrodes 15b having the same rectangular (square) shape as the pixel electrodes 15a are formed on the dummy electrode regions 300 respectively. The interval between the dummy electrodes 15b and the corresponding pixel electrodes 15a is substantially identical to that between the plurality of pixel electrodes 15a.

In a sectional structure (taken along the line 150-150 in FIG. 1) of a portion close the boundary between the pixel array region 200 and each dummy electrode region 300 of the CMOS image sensor 100 according to the first embodiment, element isolation regions 2 having an STI (shallow trench isolation) structure are formed on the surface of a p-type silicon substrate 1 in order to isolate the dummy electrode region 300 and the corresponding pixel 200a of the pixel array region 200 from each other, as shown in FIG. 2. These element isolation regions 2 are formed by embedding element isolation films 2a in trenches 1a formed on the surface of the p-type silicon substrate 1. A pair of n-type source/drain regions 4a are formed on a surface portion of the p-type silicon substrate 1 corresponding to each pixel 200a enclosed with the element isolation films 2a at a prescribed interval, to hold a channel region 3a therebetween. Each source/drain region 4a has an LDD (lightly doped drain) structure formed by an n-type low-concentration impurity region 5a and an n-type high-concentration impurity region 6a. A gate electrode 8a is formed on the channel region 3a through a gate insulating film 7a. Side wall insulating films 9a are formed on the side surfaces of the gate electrode 8a. The channel region 3a, the source/drain regions 4a, the gate insulating film 7a and the gate electrode 8a constitute a reset transistor 201. The reset transistor 201 is an example of the "second transistor" in the present invention. On the other hand, a pair of n-type source/drain regions 4b are formed on a surface portion of the p-type silicon substrate 1 corresponding to the dummy electrode region 300 enclosed with the element isolation films 2a at a prescribed interval, to hold a channel region 3b therebetween. Each source/drain region 4b has an LDD structure formed by an n-type low-concentration impurity region 5b and an n-type high-concentration impurity region 6b. A gate electrode 8b is formed on the channel region 3b through a gate insulating film 7b. Side wall insulating films 9b are formed on the side surfaces of the gate electrode 8b. The channel region 3b, the source/drain regions 4b, the gate insulating film 7b and the gate electrode 8b constitute a charge ejection transistor 301. The gate insulating films 7a and 7b are made of $SiO_2$, and have a thickness of about 10 nm. The gate electrodes 8a and 8b are prepared from the same polysilicon film 8 (see FIG. 9) in a manufacturing process described later, and have a thickness of about 200 nm. The charge ejection transistor 301 is an example of the "first transistor" in the present invention.

An interlayer dielectric film 10 of $SiO_2$ having a thickness of about 600 nm is formed on the surface of the p-type silicon substrate 1, to cover the element isolation films 2a, the reset transistor 201 and the charge ejection transistor 301. Contact holes 10a, 10b and 10c are formed in regions of the interlayer dielectric film 10 corresponding to the first source/drain region 4a of the reset transistor 201 and the pair of source/drain regions 4b of the charge ejection transistor 301 respectively. Plugs 11a, 11b and 11c of tungsten or the like are embedded in these contact holes 10a, 10b and 10c, to be electrically connected to the first source/drain region 4a of the reset transistor 201 and the pair of source/drain regions 4b of the charge ejection transistor 301 respectively.

Interconnection layers 12a, 12b and 12c are formed on the upper surfaces of the plugs 11a, 11b and 11c, to be electrically connected with the plugs 11a, 11b and 11c respectively. The interconnection layers 12a, 12b and 12c are made of Al or the like, and have a thickness of about 500 nm. A positive potential (power supply potential Vcc, for example) is applied to the interconnection layer 12c. This interconnection layer 12c is so formed as to extend toward an end of the p-type silicon substrate 1 with respect to the dummy electrode 15b.

Another interlayer dielectric film 13 of $SiO_2$ having a thickness of about 1000 nm is formed on the upper surface of the interlayer dielectric film 10, to cover the interconnection layers 12a, 12b and 12c. Contact holes 13a and 13b are formed in regions of the interlayer dielectric film 13 corresponding to the interconnection layers 12a and 12b respectively. Plugs 14a and 14b of tungsten or the like are embedded in these contact holes 13a and 13b, to be electrically connected with the interconnection layers 12a and 12b respectively.

According to the first embodiment, the pixel electrode 15a and the dummy electrode 15b are formed on the upper surfaces of the plugs 14a and 14b, to be electrically connected with the plugs 14a and 14b respectively. The pixel electrode 15a and the dummy electrode 15b are made of TiN or the like, and have a thickness of about 30 nm. The pixel electrode 15a and the dummy electrode 15b are formed on regions corresponding to the pixel 200a and the dummy electrode region 300 respectively. The dummy electrode 15b is formed for ejecting charges generated by a photoelectric conversion film 16 between an end of the photoelectric conversion film 16 and an end of the corresponding pixel electrode 15a.

The photoelectric conversion film 16 is formed on the upper surface of the interlayer dielectric film 13, to cover the pixel electrode 15a and the dummy electrode 15b. Thus, the CMOS image sensor 100 according to the first embodiment has a stacked structure formed by stacking the photoelectric conversion film 16 on the pixel electrode 15a and the dummy electrode 15b. This photoelectric conversion film 16 is constituted of an n-type amorphous silicon film 16a of about 50 nm in thickness so formed as to cover the pixel electrode 15a and the dummy electrode 15b, an i-type amorphous silicon film 16b of about 300 nm in thickness formed on the n-type amorphous silicon film 16a and a p-type amorphous silicon film 16c of about 50 nm in thickness formed on the i-type amorphous silicon film 16b. The photoelectric conversion film 16 has a function of generating charges by photoelectrically converting incident light.

A transparent electrode 17 of ITO (indium tin oxide) or the like having a thickness of about 100 nm is formed on the upper surface of the p-type amorphous silicon film 16c of the photoelectric conversion film 16. A negative potential is applied to the transparent electrode 17, thereby prompting charges (electrons) generated in the photoelectric conversion film 16 to move toward the pixel electrode 15a and the dummy electrode 15b.

The circuit structure of the CMOS image sensor 100 according to the first embodiment shown in FIGS. 1 and 2 is described with reference to FIG. 3.

The CMOS image sensor 100 according to the first embodiment comprises a vertical scanning circuit 401 and a horizontal scanning circuit 402 for selecting any of the pixels 200a arranged in the form of a matrix, an amplifier/noise cancellation circuit 403 for correcting dispersion in offset of signal charges and an output portion 404.

Each pixel 200a of the CMOS image sensor 100 includes the aforementioned reset transistor 201 for resetting the pixel electrode 15a by ejecting charges present therein after reading the charges, an amplification transistor 202 for amplifying charges generated by the photoelectric conversion film 16 constituting a photodiode to flow into the pixel electrode 15a and a selection transistor 203 for vertical scanning. The amplification transistor 202 is an example of the "third transistor" in the present invention.

The reset transistor 201 of the pixel 200a has a first source/drain region connected to the pixel electrode 15a and a gate connected to a reset signal line. The positive potential (power supply potential Vcc) is applied to the second source/drain region of the reset transistor 201.

The amplification transistor 202 of the pixel 200a has a first source/drain region connected to the amplifier/noise cancellation circuit 403 and a second source/drain region connected to the first source/drain region of the selection transistor 203. The pixel electrode 15a is electrically connected to the gate of the amplification transistor 202.

The gate of the selection transistor 203 of the pixel 200a is connected to the vertical scanning circuit 401. The positive potential (power supply potential Vcc) is applied to the second source/drain region of the selection transistor 203.

According to the first embodiment, the charge ejection transistor 301 for controlling ejection of charges flowing into the dummy electrode 15b connected to the photoelectric conversion film 16 constituting the photodiode is provided on each dummy electrode region 300 of the CMOS image sensor 100, as hereinabove described. This charge ejection transistor 301 has a first source/drain region electrically connected to the dummy electrode 15b and a gate connected to a charge ejection signal line (not shown). The positive potential (power supply potential Vcc, for example) is applied to a second source/drain region of the charge ejection transistor 301. This charge ejection transistor 301 is controlled into an ON-state through the charge ejection signal line before an operation of reading charges from the pixel electrode 15a, for ejecting the charges flowing into the dummy electrode 15b.

The horizontal scanning circuit 402 of the CMOS image sensor 100 includes a plurality of selection transistors 402a for selecting respective pixel trains. Each selection transistor 402a of the horizontal scanning circuit 402 has a first source/drain region connected to the amplifier/noise cancellation circuit 403 and a second source/drain region connected to the output portion 404. The gate of the selection transistor 402a is connected to the horizontal scanning circuit 402.

A charge ejecting operation of the CMOS image sensor 100 according to the first embodiment is now described with reference to FIGS. 2 to 4.

Figure 4:
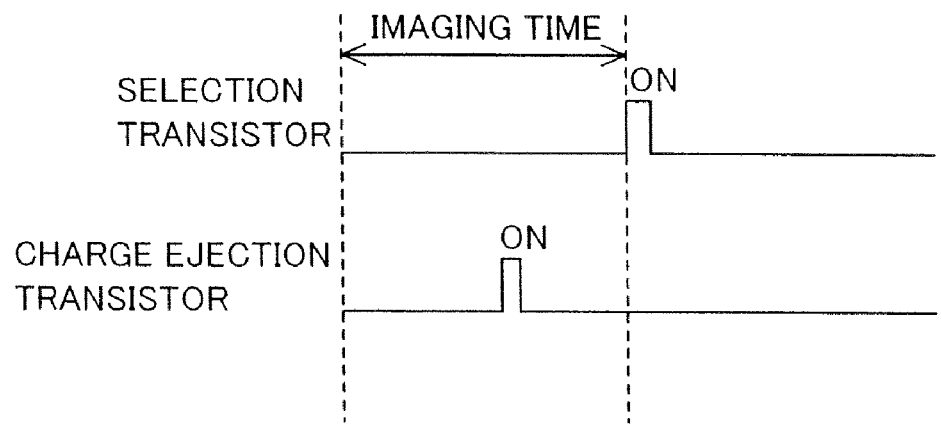

First, charges generated through incidence of light upon the photoelectric conversion film 16 in an imaging time (about 0.5 msec. to about 50 msec., for example) so move as to flow into each pixel electrode 15a and each dummy electrode 15b through the internal field of the photoelectric conversion film 16 and the negative potential applied to the transparent electrode 17, as shown in FIGS. 2 and 4.

According to the first embodiment, the charge ejection transistor 301 of each dummy electrode region 300 is turned on for a prescribed period before termination of the imaging time, thereby ejecting charges flowing into the dummy electrode 15b. As hereinabove described, the positive potential (power supply potential Vcc, for example) is applied to the interconnection layer 12c, whereby the charges flowing into the dummy electrode 15b are ejected through the plug 14b, the interconnection layer 12b, the plug 11b, the pair of source/drain regions 4b of the charge ejection transistor 301, the plug 11c and the interconnection layer 12c during the ON period of the charge ejection transistor 301.

Figure 3:
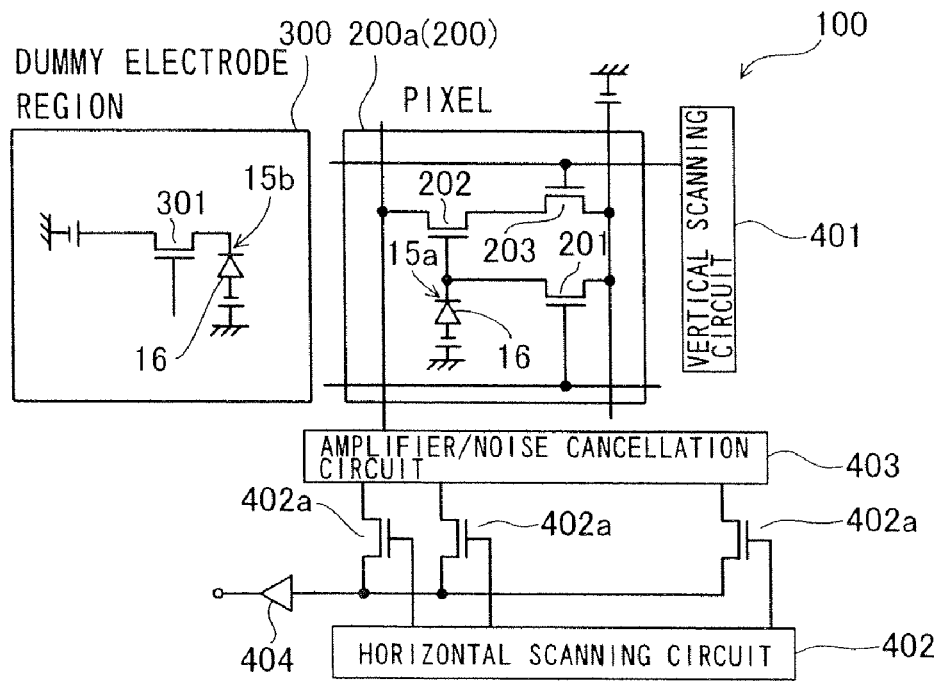
FIG. 3 is a circuit diagram of the CMOS image sensor according to the first embodiment of the present invention.

After termination of the imaging time, the selection transistor 203 of the pixel 200a shown in FIG. 3 is turned on, for reading charges from the pixel electrode 15a. More specifically, the selection transistor 203 is so turned on as to apply the positive potential (power supply potential Vcc) to the second source/drain region of the amplification transistor 202. At this time, the strength of the ON-state of the amplification transistor 202 varies with the quantity of charges flowing into the pixel electrode 15a, whereby the quantity of current flowing in the amplifier/noise cancellation circuit 403 through the amplification transistor 202 varies with the quantity of charges, amplified by the amplification transistor 202, of the pixel electrode 15a. The current corresponding to the quantity of charges in the pixel electrode 15a is converted to a voltage, which in turn is read from the output portion 404 as a signal of the pixel 200a.

Thereafter the reset transistor 201 is turned on, for ejecting the charges from the pixel electrode 15a and resetting the pixel electrode 15a. More specifically, the reset transistor 201 is turned on while the positive potential (power supply potential Vcc) is applied to the second source/drain region 4a of the reset transistor 201, whereby the charges remaining in the pixel electrode 15a are ejected through the plug 14a, the interconnection layer 12a, the plug 11a and the pair of source/drain regions 4a of the reset transistor 201, as shown in FIGS. 2 and 3.

According to the first embodiment, as hereinabove described, the charge ejection transistor 301 for controlling ejection of the charges flowing into the dummy electrode 15b is so provided that the quantity of charges flowing into the dummy electrode 15b can be controlled with the charge ejection transistor 301, whereby parts of charges generated in the vicinity of the boundary between each endmost pixel electrode 15a and the corresponding dummy electrode 15b to flow into the endmost pixel electrode 15a can be prevented from ejection through the corresponding dummy electrode 15b. Thus, the quantity of charges in the pixel 200a corresponding to the endmost pixel electrode 15a adjacent to the dummy electrode 15b can be prevented from reduction, whereby the endmost pixel 200a can be inhibited from darkening. Charges generated between the end of the photoelectric conversion film 16 and ends of the plurality of pixel electrodes 15a can be ejected through the corresponding dummy electrodes 15b, whereby each endmost pixel 200a can be inhibited from brightening. Thus, the quantity of charges flowing into each endmost pixel electrode 15a can be correctly controlled in the first embodiment.

According to the first embodiment, the charge ejection transistor 301 is so arranged under the region provided with the dummy electrode 15b that no step is formed between the dummy electrode region 300 and the pixel 200a provided with the reset transistor 201 thereunder, whereby the portions of the photoelectric conversion film 16 provided on the dummy electrode region 300 and the pixel 200a respectively can be flattened. Thus, the thickness of a color filter formed on the photoelectric conversion film 16 and the transparent electrode 17 by coating can be so uniformized as to suppress deterioration of color reproducibility.

According to the first embodiment, the charge ejection transistor 301 is controlled into an ON-state before the operation of reading charges from the pixel electrode 15a for ejecting the charges flowing into the dummy electrode 15b thereby ejecting unwanted charges flowing into the dummy electrode 15b before the operation of reading charges from the pixel electrode 15a, whereby the unwanted charges can be easily ejected before the operation of reading charges from the pixel electrode 15a.

According to the first embodiment, the first source/drain region 4b of the charge ejection transistor 301 is electrically connected to the dummy electrode 15b while the positive potential is applied to the second source/drain region 4b of the charge ejection transistor 301, whereby ejection of charges from the dummy electrode 15b can be easily controlled by controlling ON and OFF states of the charge ejection transistor 301.

According to the first embodiment, the plurality of pixel electrodes 15a are arranged in the form of a matrix while the dummy electrodes 15b are so arranged as to enclose the pixel array region 200 having the pixel electrodes 15a arranged in the form of a matrix so that charges flowing into all pixel electrodes 15a located on the outer periphery of the pixel array region 200 can be correctly controlled, whereby all pixels 200a located on the outer periphery of the pixel array region 200 can be inhibited from darkening or brightening.

According to the first embodiment, the CMOS image sensor 100 is provided with the reset transistor 201 connected to each pixel electrode 15a while the gate electrode 8b of each charge ejection transistor 301 is formed by the same polysilicon film 8 as the gate electrode 8a of the reset transistor 201 so that the gate electrode 8b of the charge ejection transistor 301 can be formed simultaneously with formation of the gate electrode 8a of the reset transistor 201, whereby increase of the number of manufacturing steps can be suppressed.

A method of manufacturing the CMOS image sensor 100 according to the first embodiment is now described with reference to FIGS. 1, 2 and 5 to 24.

Figure 5:
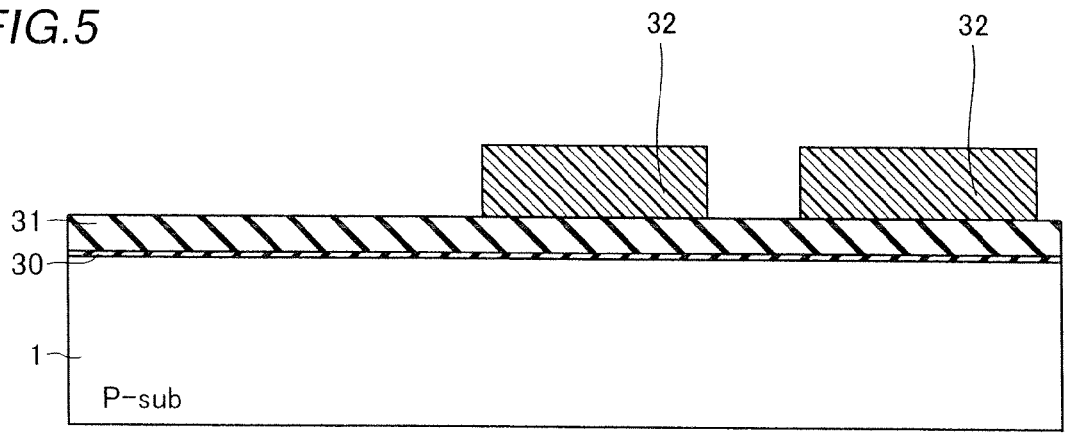
FIGS. 5 to 24 are sectional views for illustrating a method of manufacturing the CMOS image sensor according to the first embodiment of the present invention.
Figure 6:
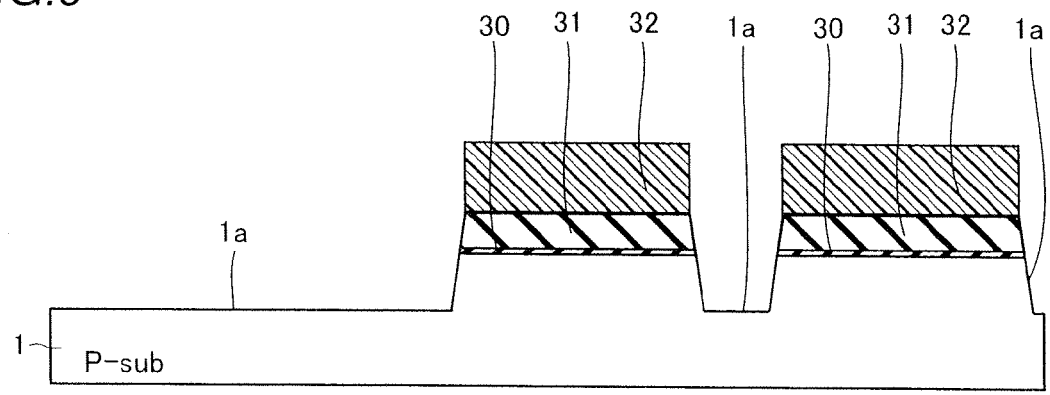

First, the surface of the p-type silicon substrate 1 is thermally oxidized thereby forming a silicon oxide film 30 having a thickness of about 20 nm, as shown in FIG. 5. Then, a silicon nitride film 31 having a thickness of about 200 nm is formed on the upper surface of the silicon oxide film 30. Thereafter resist films 32 are formed on prescribed regions of the silicon nitride film 31 by photolithography. The resist films 32 are employed as masks for etching the silicon nitride film 31, the silicon oxide film 30 and the p-type silicon substrate 1 up to a depth of about 350 nm, thereby forming the trenches 1a as shown in FIG. 6. Thereafter the resist films 32 are removed. The inner surfaces of the trenches 1a of the p-type silicon substrate 1 are thermally oxidized, thereby forming silicon oxide films (not shown) having a thickness of about 20 nm.

Figure 7:
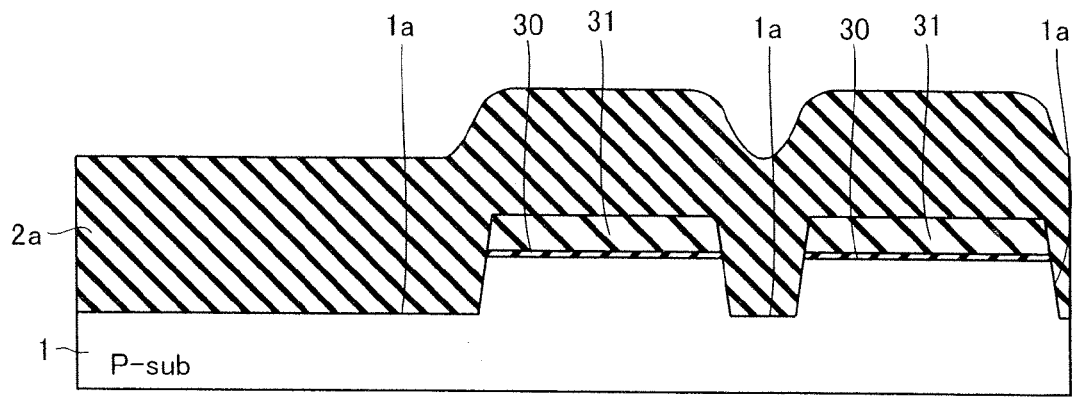
Figure 8:
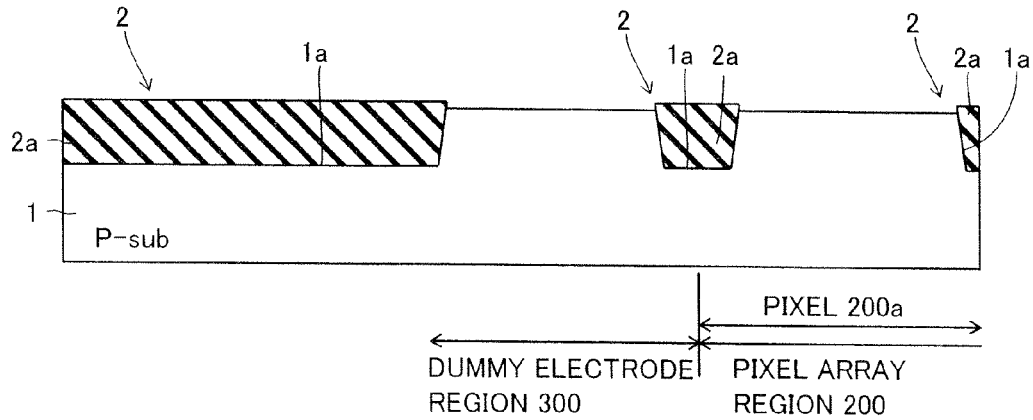

As shown in FIG. 7, an element isolation film 2a of silicon oxide having a thickness of about 800 nm is formed to cover the overall surface. Then, the element isolation film 2a is polished by about 800 nm and flattened by CMP (chemical mechanical polishing) through the silicon nitride film 31 serving as a stopper. Thereafter the silicon nitride film 31 and the silicon oxide film 30 are removed, thereby forming the element isolation regions 2 of the STI structure on the surface of the p-type silicon substrate 1, as shown in FIG. 8.

Figure 9:
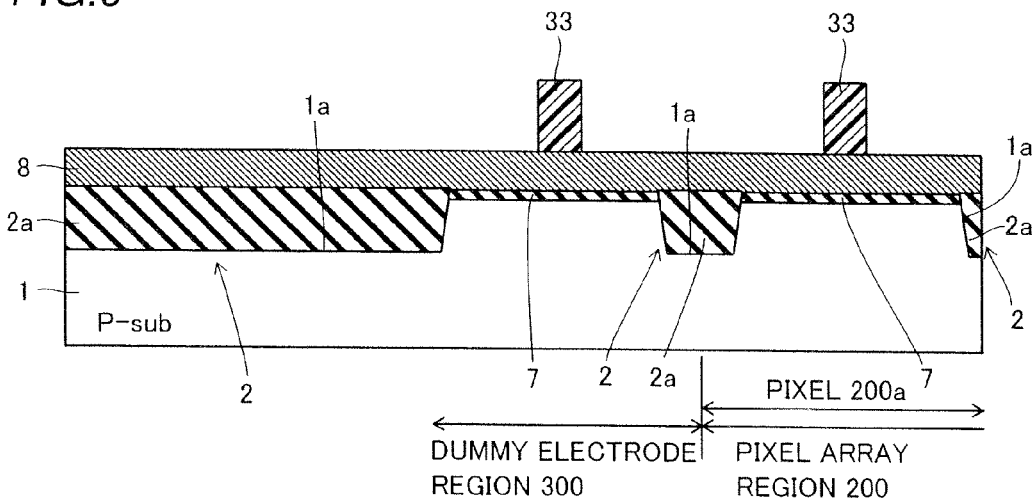
Figure 10:
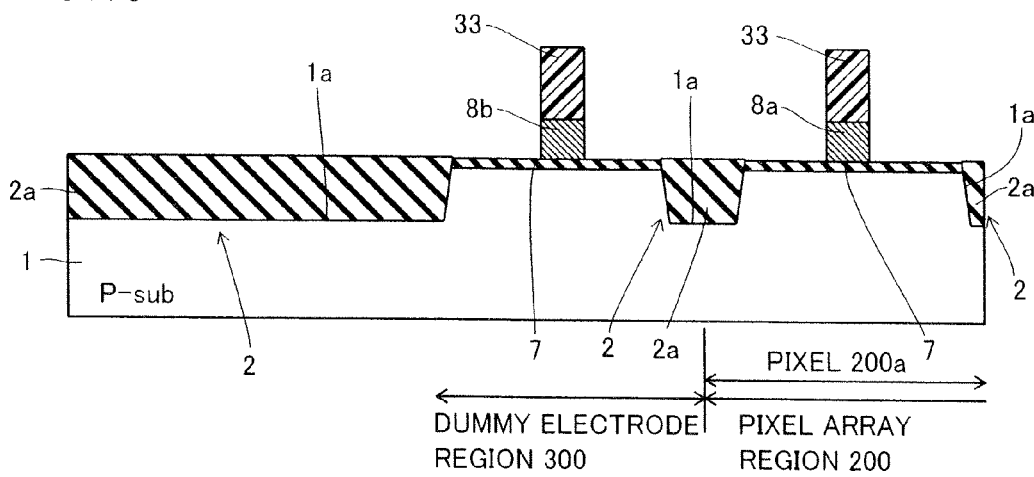

As shown in FIG. 9, exposed surface portions of the p-type silicon substrate 1 are thermally oxidized, thereby forming silicon oxide films 7 having a thickness of about 10 nm. Thereafter the polysilicon film 8 having a thickness of about 200 nm is formed on the upper surfaces of the silicon oxide films 7 and the element isolation films 2a of the element isolation regions 2. Then, resist films 33 are formed on prescribed regions of the polysilicon film 8 by photolithography. The resist films 33 are employed as masks for etching the polysilicon film 8, thereby forming the gate electrodes 8a and 8b as shown in FIG. 10. Thereafter the resist films 33 are removed.

Figure 11:
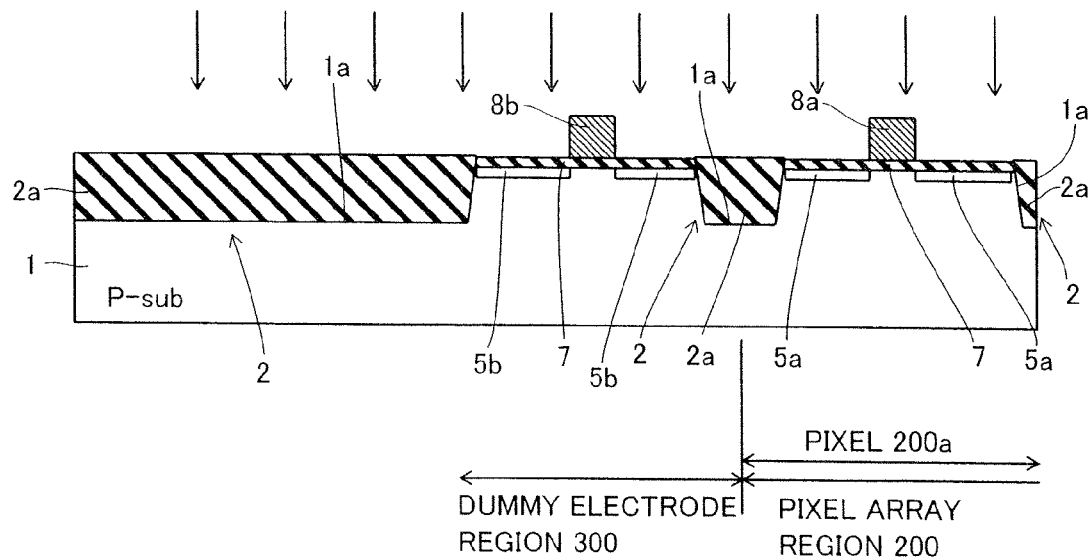

As shown in FIG. 11, the element isolation films 2a of the element isolation regions 2 and the gate electrodes 8a and 8b are employed as masks for ion-implanting an n-type impurity into the surface of the p-type silicon substrate 1. Thus, a pair of n-type low-concentration impurity regions 5a are formed on the surface portion of the p-type silicon substrate 1 corresponding to each pixel 200a of the pixel array region 200 while a pair of n-type low-concentration impurity regions 5b are formed on the surface portion of the p-type silicon substrate 1 corresponding to each dummy electrode region 300.

Figure 12:
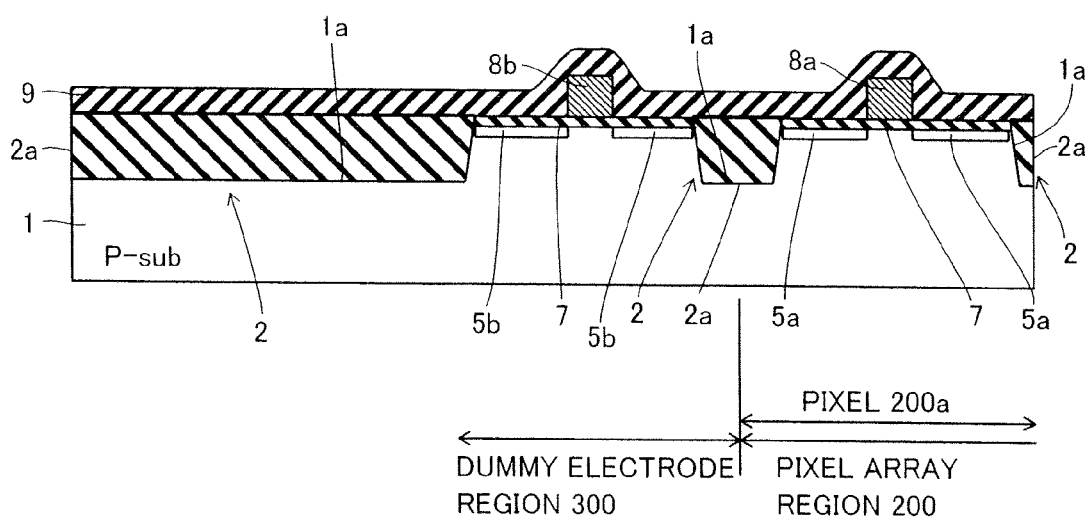
Figure 13:
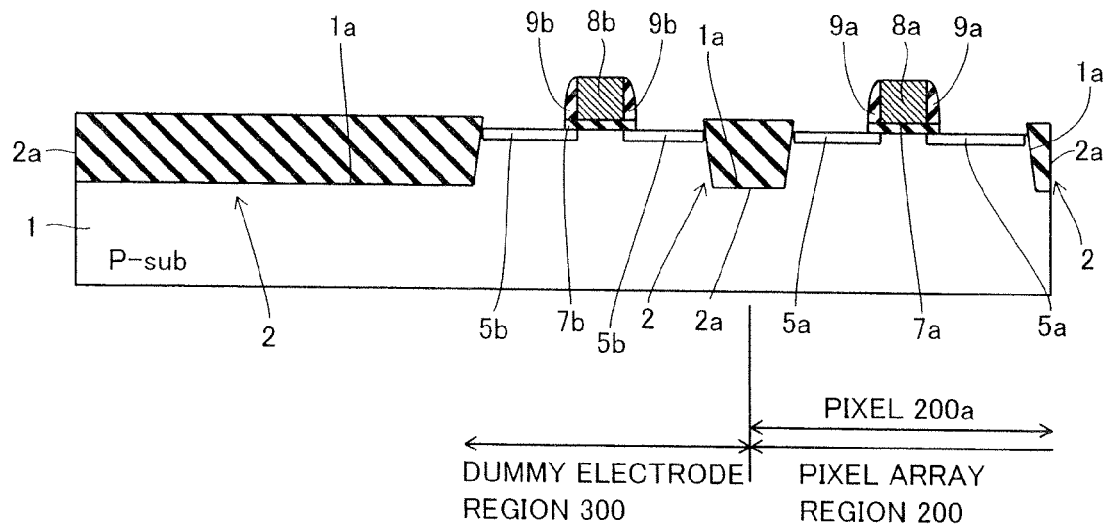

As shown in FIG. 12, a silicon oxide film 9 having a thickness of about 150 nm is formed to cover the overall surface. Thereafter the silicon oxide film 9 is so etched back as to form the side wall insulating films 9a and 9b on the side surfaces of the gate electrodes 8a and 8b, as shown in FIG. 13. Thus, the silicon oxide films 7 are patterned for simultaneously forming the gate insulating films 7a and 7b.

Figure 14:
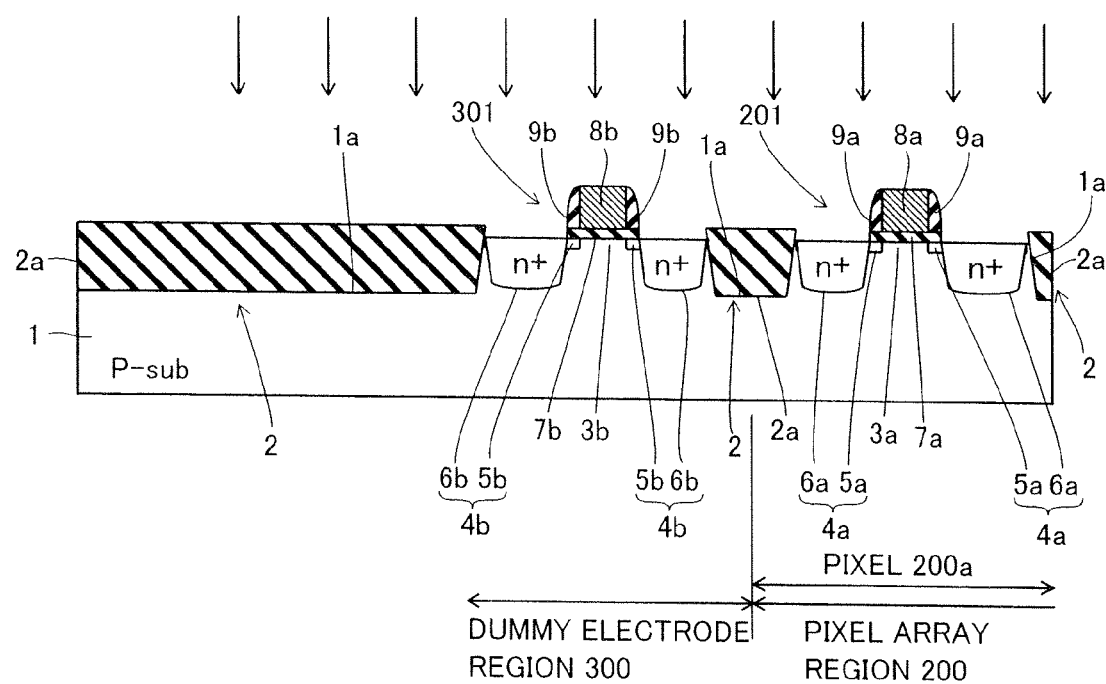

As shown in FIG. 14, the element isolation films 2a of the element isolation regions 2, the gate electrodes 8a and 8b and the side wall insulating films 9a and 9b are employed as masks for ion-implanting an n-type impurity into the surface of the p-type silicon substrate 1. Thus, a pair of n-type high-concentration impurity regions 6a are formed on the surface portion of the p-type silicon substrate 1 corresponding to each pixel 200a of the pixel array region 200 while a pair of n-type high-concentration impurity regions 6b are formed on the surface portion of the p-type silicon substrate 1 corresponding to each dummy electrode region 300. Thus, the reset transistor 201 and the charge ejection transistor 301 having LDD structures are formed on each pixel 200a of the pixel array region 200 and each dummy electrode region 300 respectively.

Figure 15:
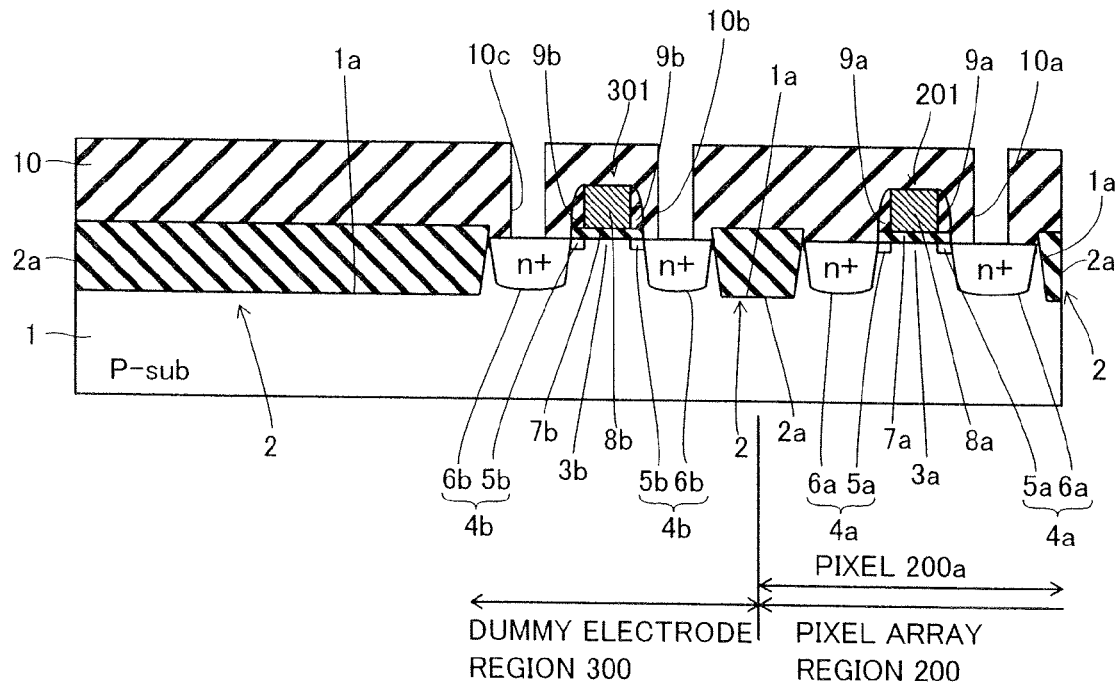

As shown in FIG. 15, the interlayer dielectric film 10 of silicon oxide having the thickness of about 800 nm is formed to cover the overall surface, and thereafter polished by about 200 nm by CMP so that the upper surface thereof is flattened. Then, the contact holes 10a, 10b and 10c are formed by photolithography and dry etching.

Figure 16:
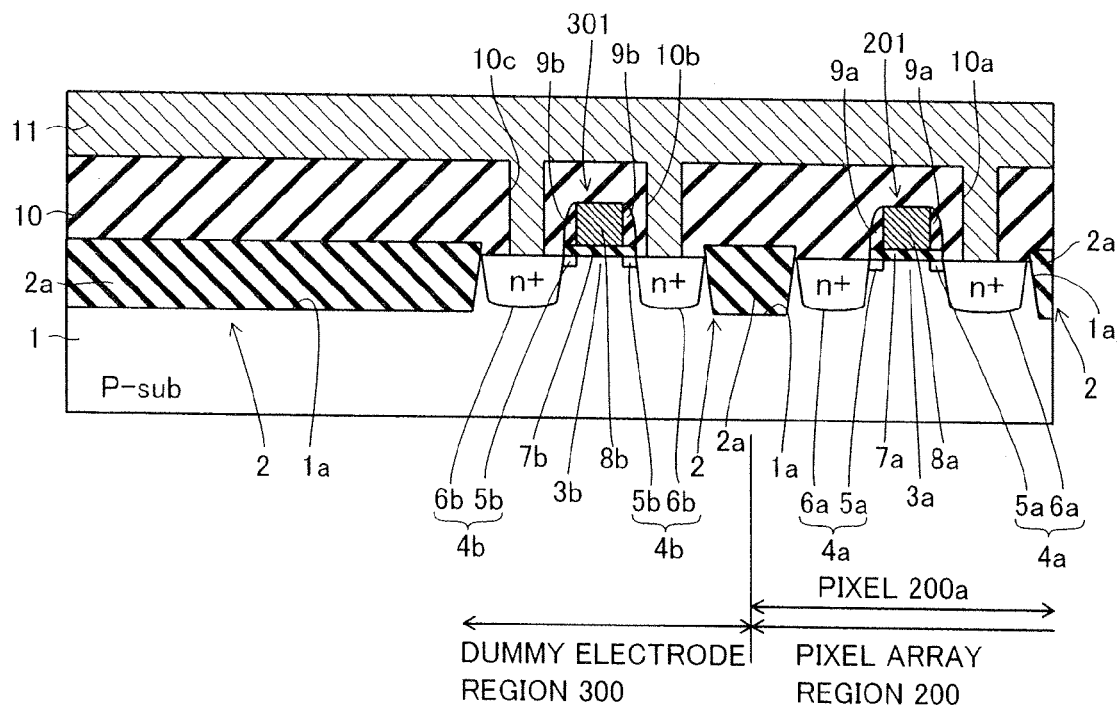
Figure 17:
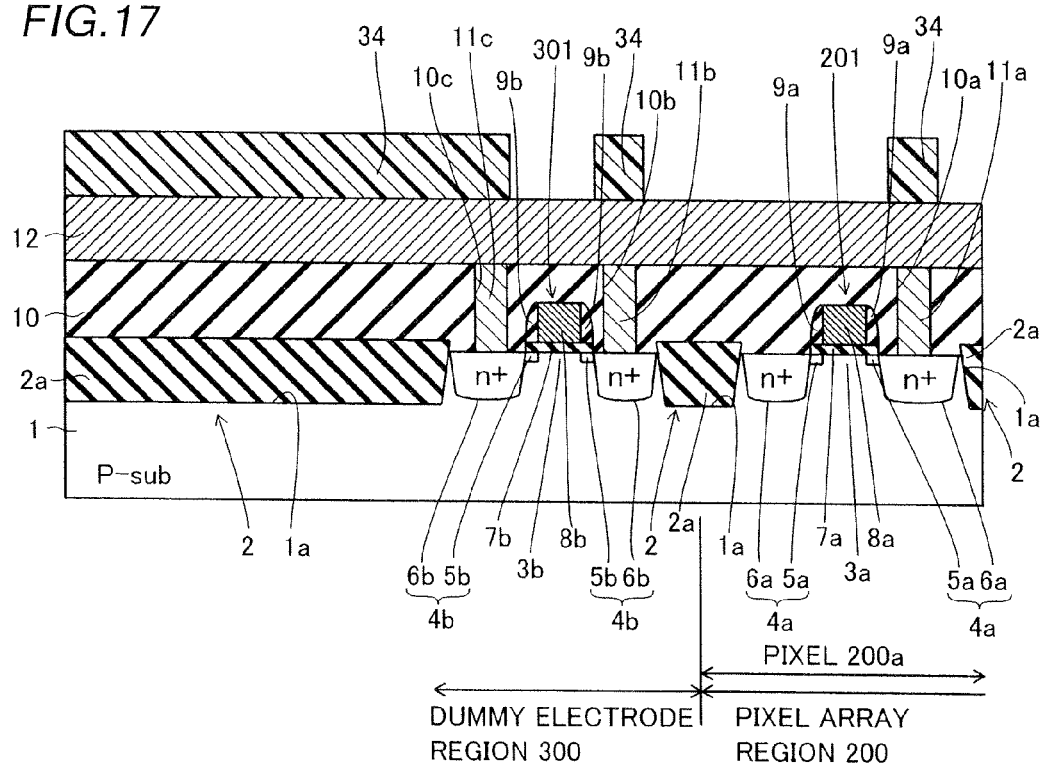
Figure 18:
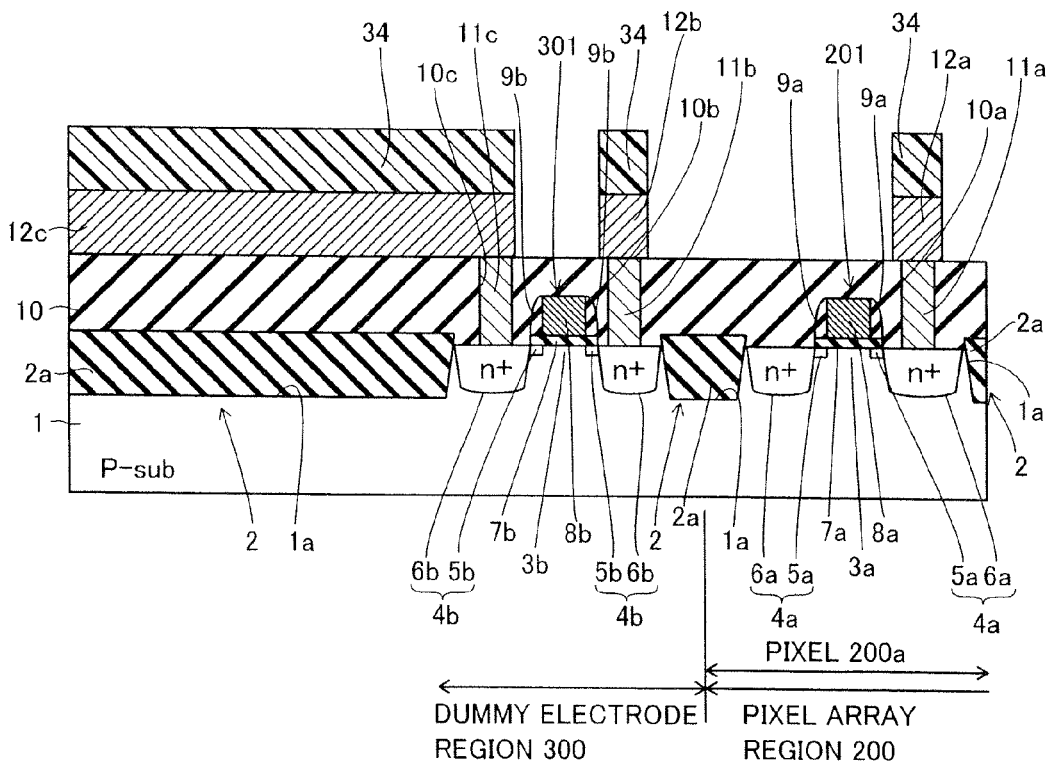

As shown in FIG. 16, a tungsten layer 11 having a thickness of about 800 nm is formed by CVD (chemical vapor deposition) to fill up the contact holes 10a, 10b and 10c and to extend on the interlayer dielectric film 10. Thereafter the tungsten layer 11 is polished by CMP, thereby forming the plugs 11a, 11b and 11c embedded in the contact holes 10a, 10b and 10c as shown in FIG. 17. Thereafter an interconnection layer 12 of Al or the like having a thickness of about 500 nm is formed on the interlayer dielectric film 10, to come into contact with the upper surfaces of the plugs 11a, 11b and 11c. Thereafter resist films 34 are formed on prescribed regions of the interconnection layer 12 by photolithography. The resist films 34 are employed as masks for etching the interconnection layer 12, thereby forming the patterned interconnection layers 12a, 12b and 12c as shown in FIG. 18. Thereafter the resist films 34 are removed.

Figure 19:
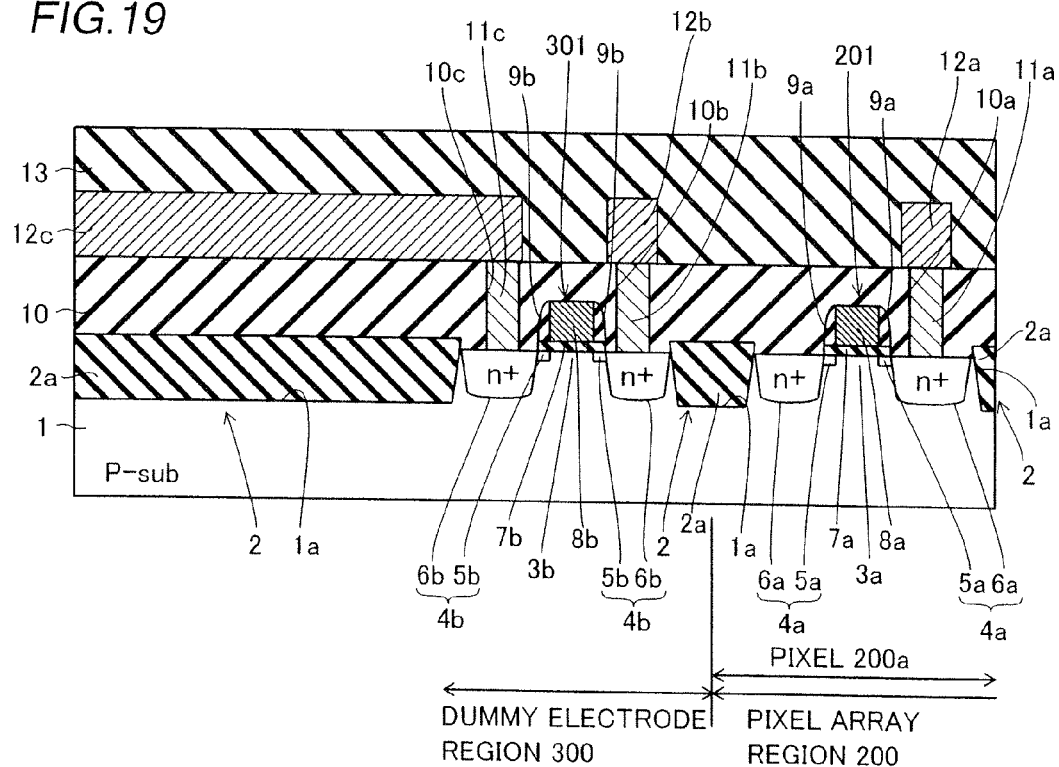

As shown in FIG. 19, the interlayer dielectric film 13 of silicon oxide having the thickness of about 1000 nm is formed on the upper surface of the interlayer dielectric film 10 to cover the interconnection layers 12a, 12b and 12c, and the upper surface thereof is thereafter polished and flattened by CMP.

Figure 20:
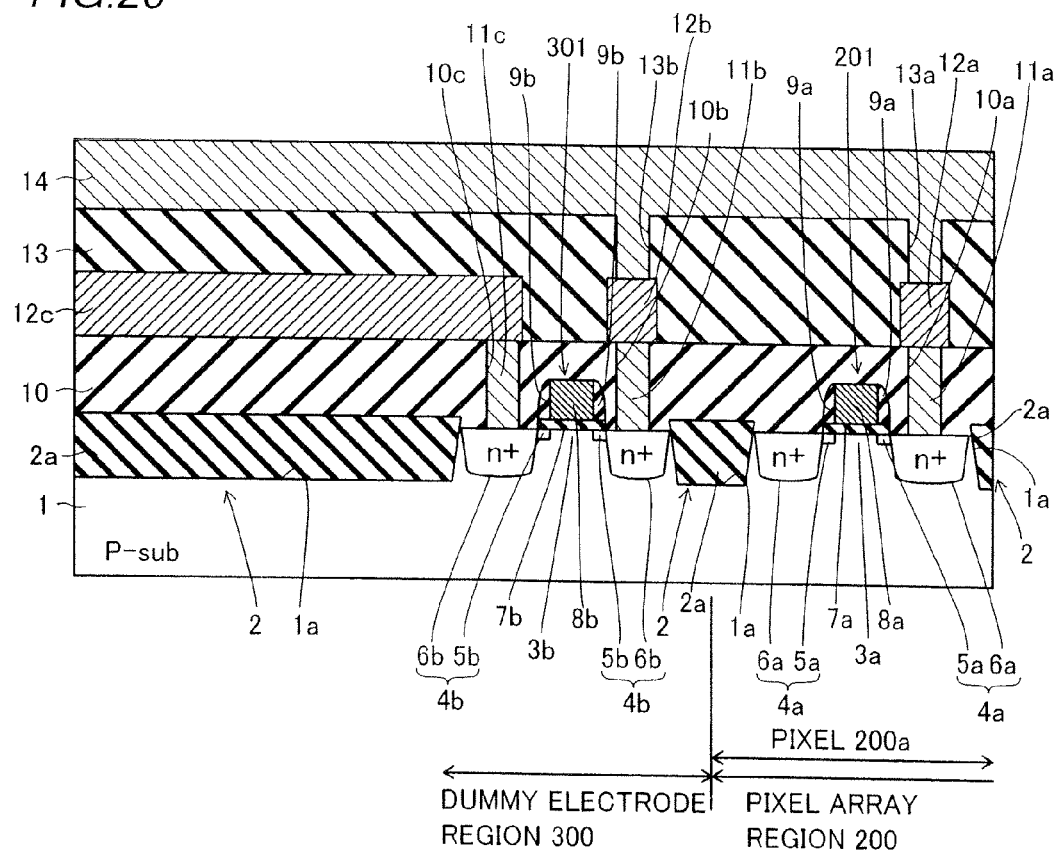
Figure 21:
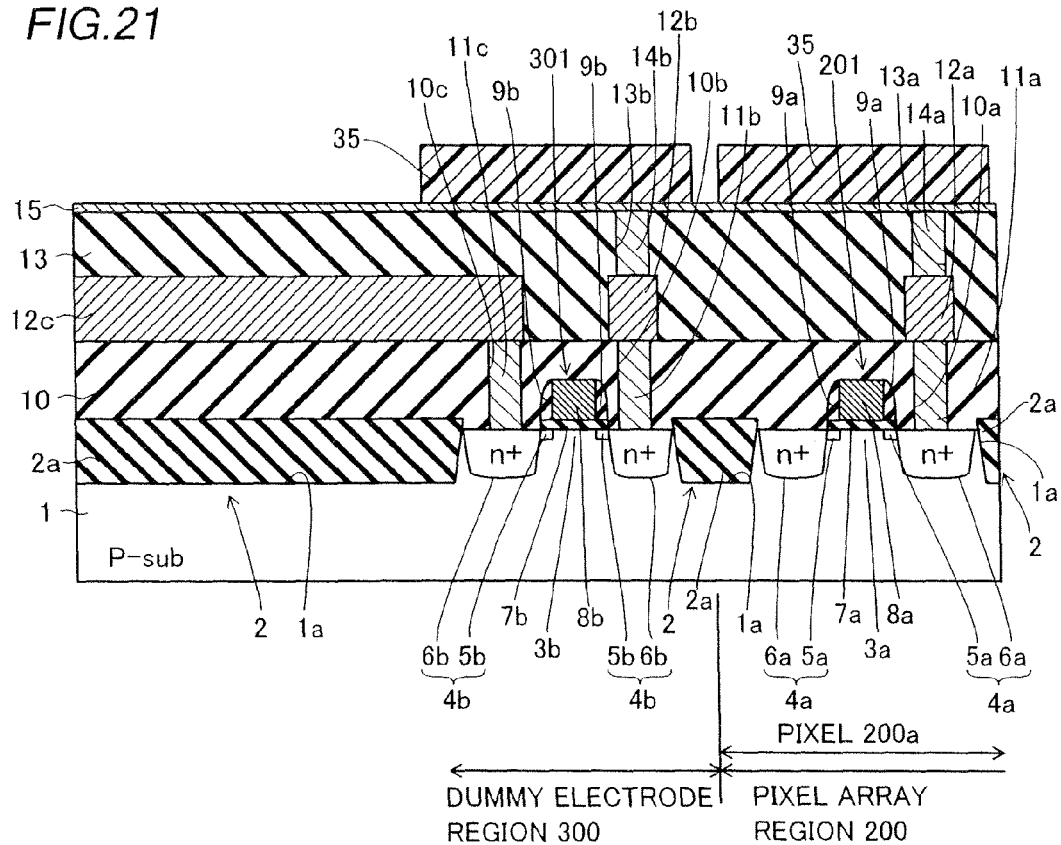
Figure 22:
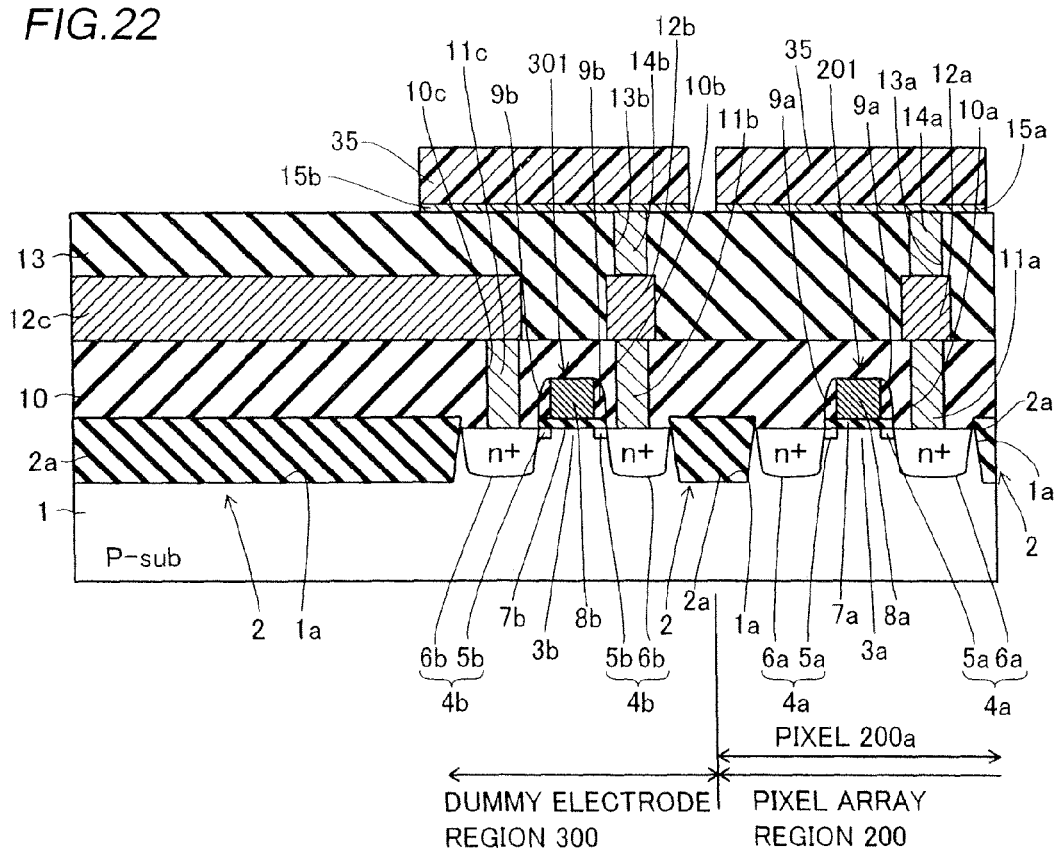

As shown in FIG. 20, the contact holes 13a and 13b are formed by photolithography and dry etching. Then, a tungsten layer 14 having a thickness of about 800 nm is formed by CVD to fill up the contact holes 13a and 13b and to extend on the interlayer dielectric film 13 and thereafter polished by CMP, thereby forming the plugs 14a and 14b embedded in the contact holes 13a and 13b as shown in FIG. 21. Thereafter an electrode layer 15 of TiN or the like having a thickness of about 30 nm is formed on the interlayer dielectric film 13 to come into contact with the upper surfaces of the plugs 14a and 14b. Thereafter resist films 35 are formed on prescribed regions of the electrode layer 15 by photolithography. The resist films 35 are employed as masks for etching the electrode layer 15, thereby forming the patterned pixel electrode 15a and the patterned dummy electrode 15b as shown in FIG. 22. Thereafter the resist films 35 are removed.

Figure 23:
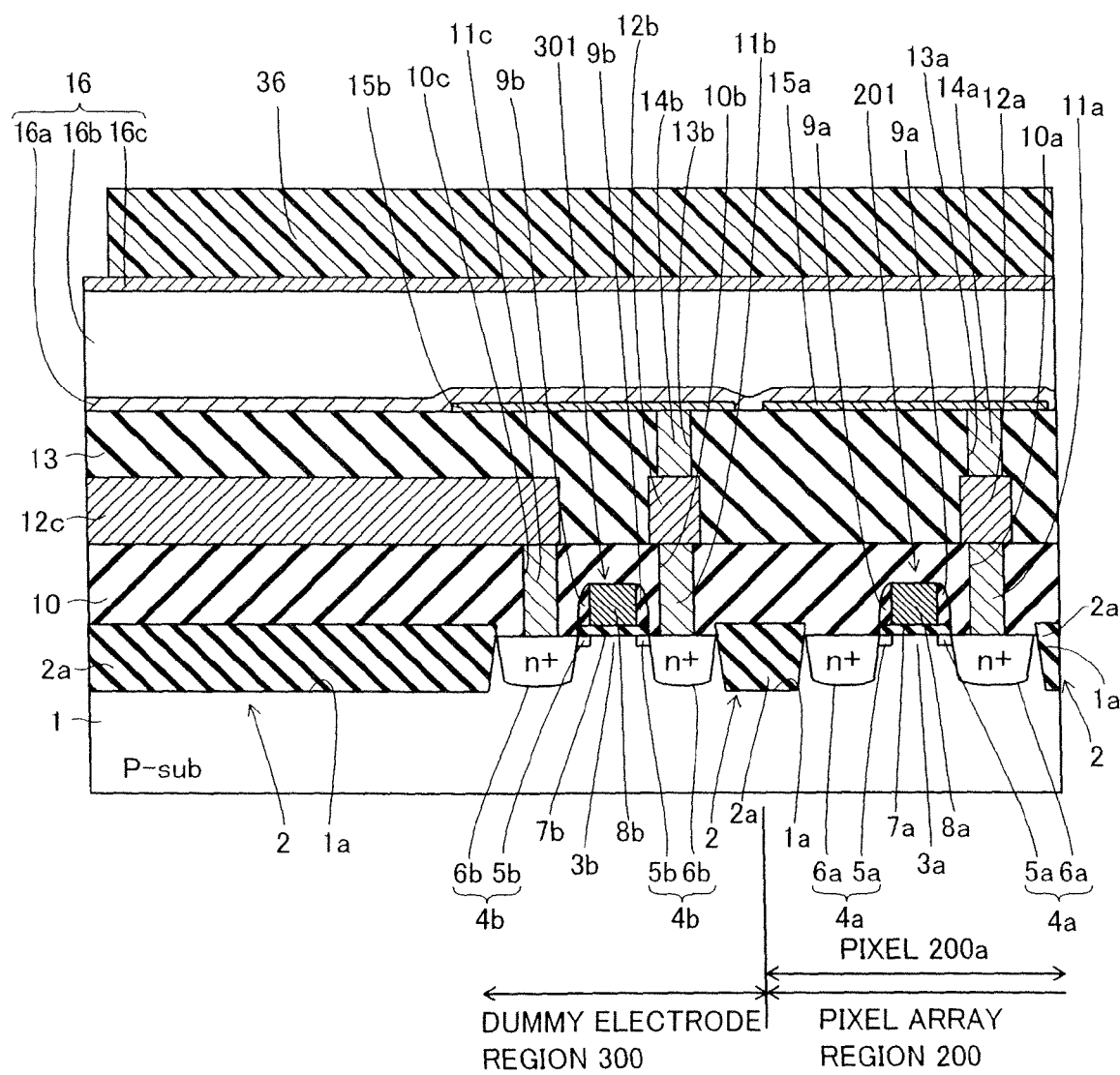
Figure 24:
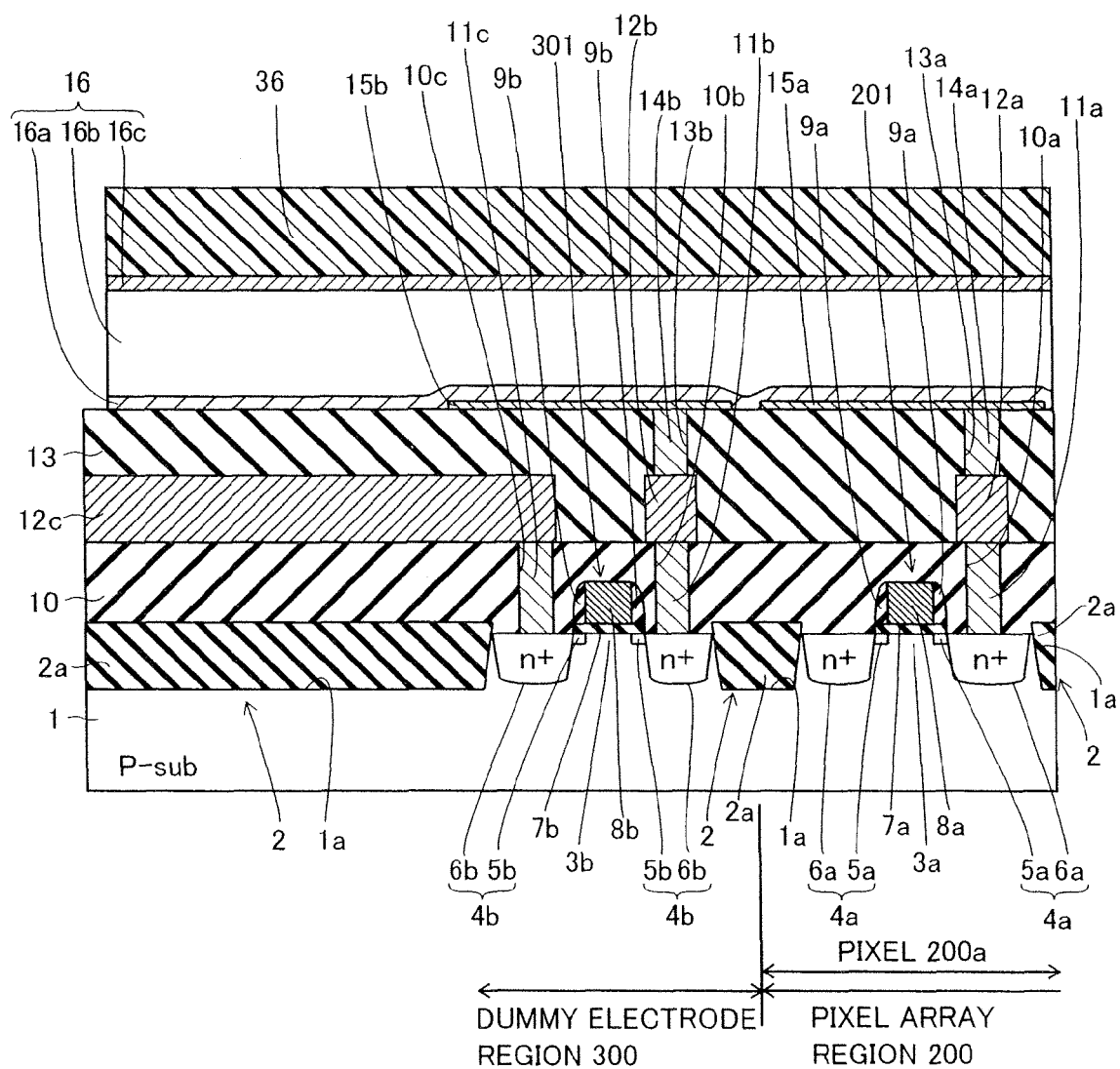

As shown in FIG. 23, the n-type amorphous silicon film 16a of about 50 nm in thickness covering the pixel electrode 15a and the dummy electrode 15b, the i-type amorphous silicon film 16b of about 300 nm in thickness and the p-type amorphous silicon film 16c of about 50 nm in thickness are successively formed on the upper surface of the interlayer dielectric film 13, thereby forming the photoelectric conversion film 16. A resist film 36 is formed on a prescribed region of the p-type amorphous silicon film 16c by photolithography. The resist film 36 is employed as a mask for etching the photoelectric conversion film 16, thereby patterning the photoelectric conversion film 16 as shown in FIG. 24. At this time, the photoelectric conversion film 16 is so formed as to entirely cover the pixel array region 200 and the dummy electrode regions 300 in a smaller size than the p-type silicon substrate 1 in plan view, as shown in FIG. 1. Thereafter the resist film 36 is removed.

Finally, the transparent electrode 17 of ITO or the like having the thickness of about 100 nm is formed on the upper surface of the p-type amorphous silicon film 16c, thereby forming the CMOS image sensor 100 according to the first embodiment as shown in FIG. 2.

Second Embodiment

Figure 25:
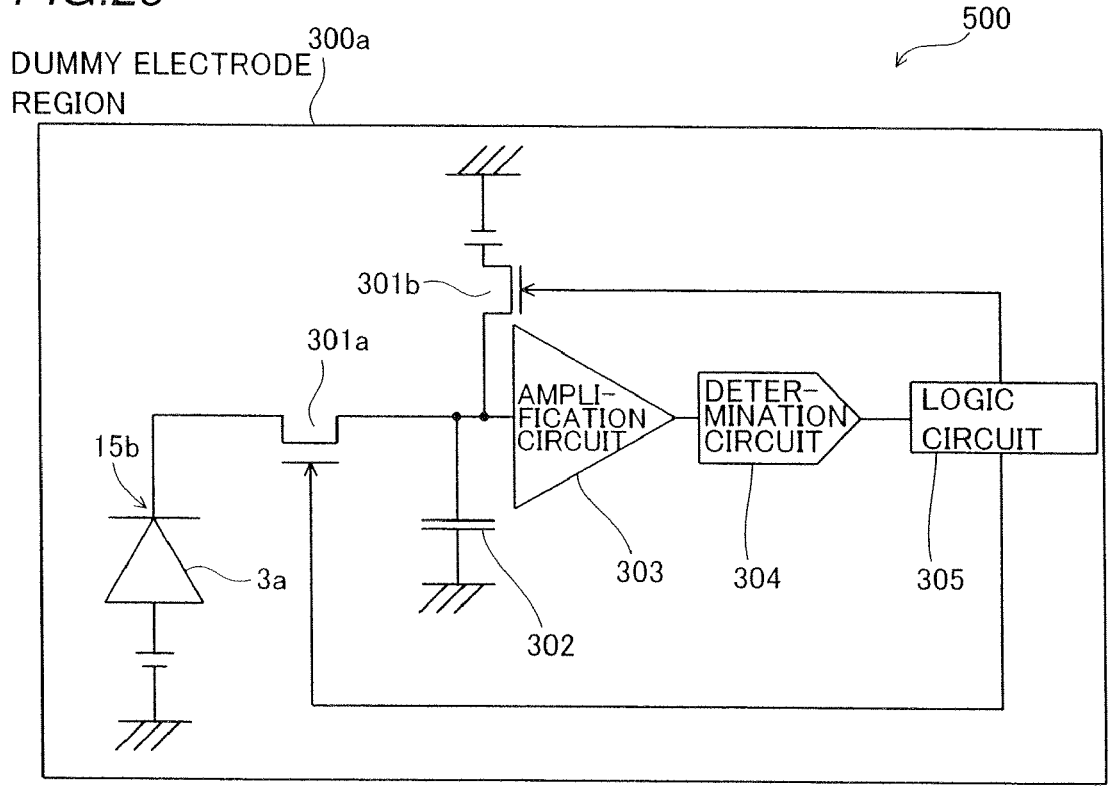
FIG. 25 is a circuit diagram of a dummy electrode region of a CMOS image sensor according to a second embodiment of the present invention.

Referring to FIG. 25, a CMOS image sensor 500 according to a second embodiment of the present invention can control the frequency for ejecting charges from each dummy electrode 15b on the basis of the quantity of charges ejected from the dummy electrode 15b, dissimilarly to the aforementioned first embodiment.

Each dummy electrode region 300a of the CMOS image sensor 500 according to the second embodiment includes charge ejection transistors 301a and 301b, a capacitor 302 for holding charges, an amplification circuit 303 amplifying and transmitting charges held in the capacitor 302, a determination circuit 304 for determining the quantity of charges held in the capacitor 303 and a logic circuit 305 for controlling ON and OFF states of the charge ejection transistors 301a and 301b. The charge ejection transistors 301a and 301b are examples of the "first transistor" in the present invention.

A charge ejecting operation of the CMOS image sensor 500 according to the second embodiment is now described with reference to FIGS. 25 and 26.

First, the logic circuit 305 turns on the charge ejection transistor 301a. Thus, charges are moved from the corresponding dummy electrode 15b and held in the capacitor 302. Thereafter the logic circuit 305 turns off the charge ejection transistor 301a.

Then, the quantity of charges held in the capacitor 302 is amplified by the amplification circuit 303 and determined by the determination circuit 304. Thereafter the logic circuit 305 turns on the charge ejection transistor 301b. Thus, the charges held in the capacitor 302 are ejected. Thereafter the logic circuit 305 turns off the charge ejection transistor 301b.

Figure 26:
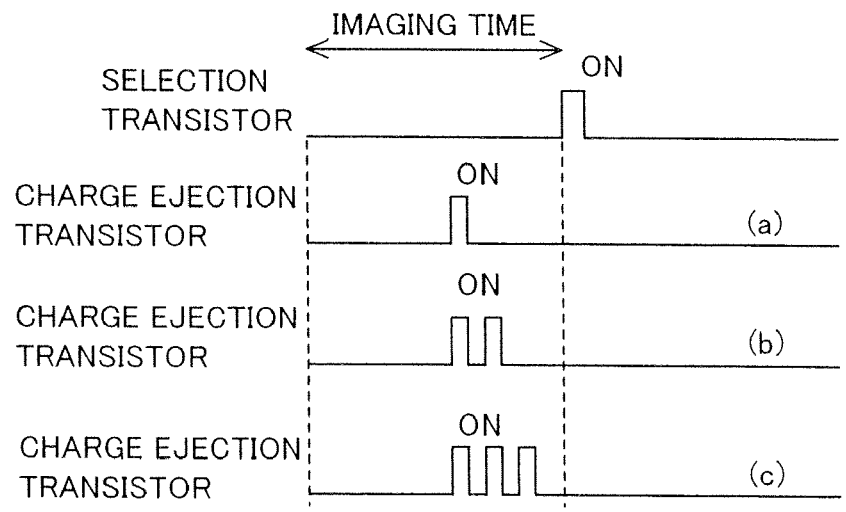
FIG. 26 is a timing chart for illustrating a charge ejecting operation of the CMOS image sensor according to the second embodiment of the present invention.

If the quantity of charges held in the capacitor 302 is smaller than a prescribed value, the logic circuit 305 terminates the charge ejecting operation at a time, as shown at (a) in FIG. 26. If the quantity of charges held in the capacitor 302 is larger than the prescribed value, on the other hand, the aforementioned charge ejecting operation is repeated until the quantity of charges held in the capacitor 302 is reduced below the prescribed value. If the quantity of charges flowing into the dummy electrode 15b is large, therefore, the charge ejection transistor 301a is turned on a plurality of times in an imaging time for repeating the charge ejecting operation, as shown at (b) and (c) in FIG. 26.

According to the second embodiment, as hereinabove described, each dummy electrode region 300a is provided with the charge ejection transistors 301a and 301b, the capacitor 302 for holding charges, the determination circuit 304 for determining the quantity of charges held in the capacitor 302 and the logic circuit 305 for controlling ON and OFF states of the charge ejection transistors 301a and 301b so that the charge ejecting operation can be repeated if the quantity of charges flowing into the dummy electrode 15b is large, whereby charges flowing into the dummy electrode 15b can be properly ejected also when the quantity of charges flowing into the dummy electrode 15b is large.

The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned first embodiment is applied to the stacked CMOS image sensor 100 formed by stacking the photoelectric conversion film 16 as an exemplary image sensor, the present invention is not restricted to this but is also applicable to another stacked image sensor such as a CCD image sensor.

Figure 27:
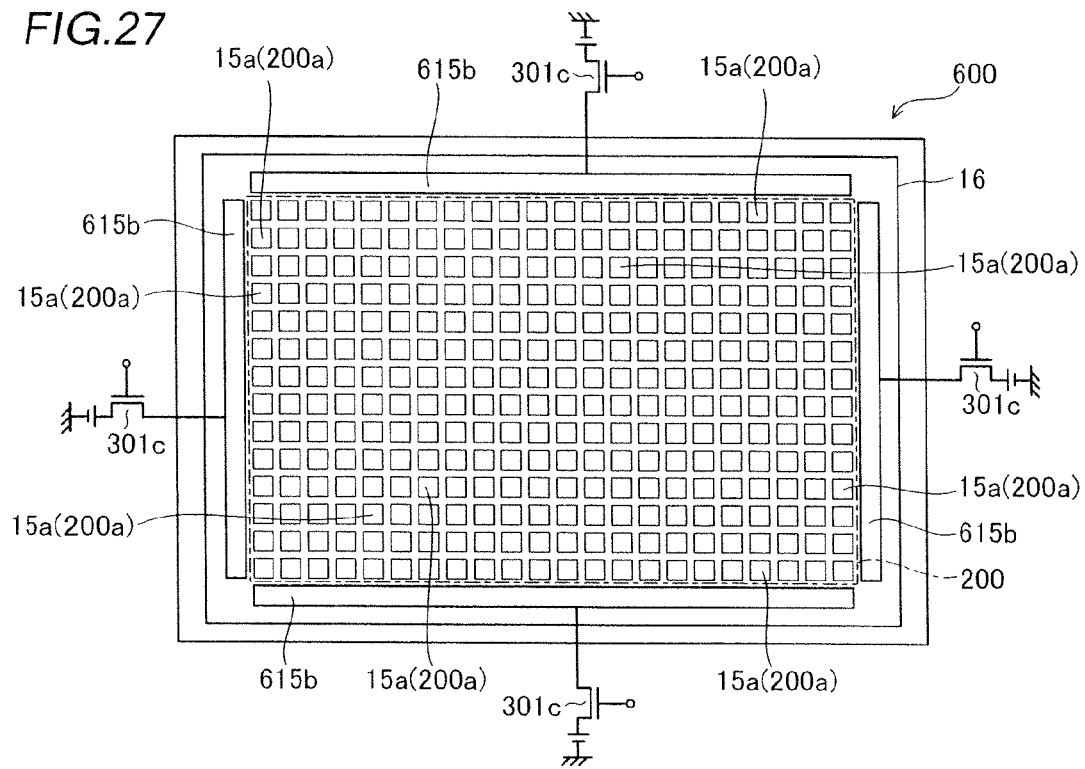
FIG. 27 is a plan view showing the overall structure of a CMOS image sensor according to a first modification of the present invention.
Figure 28:
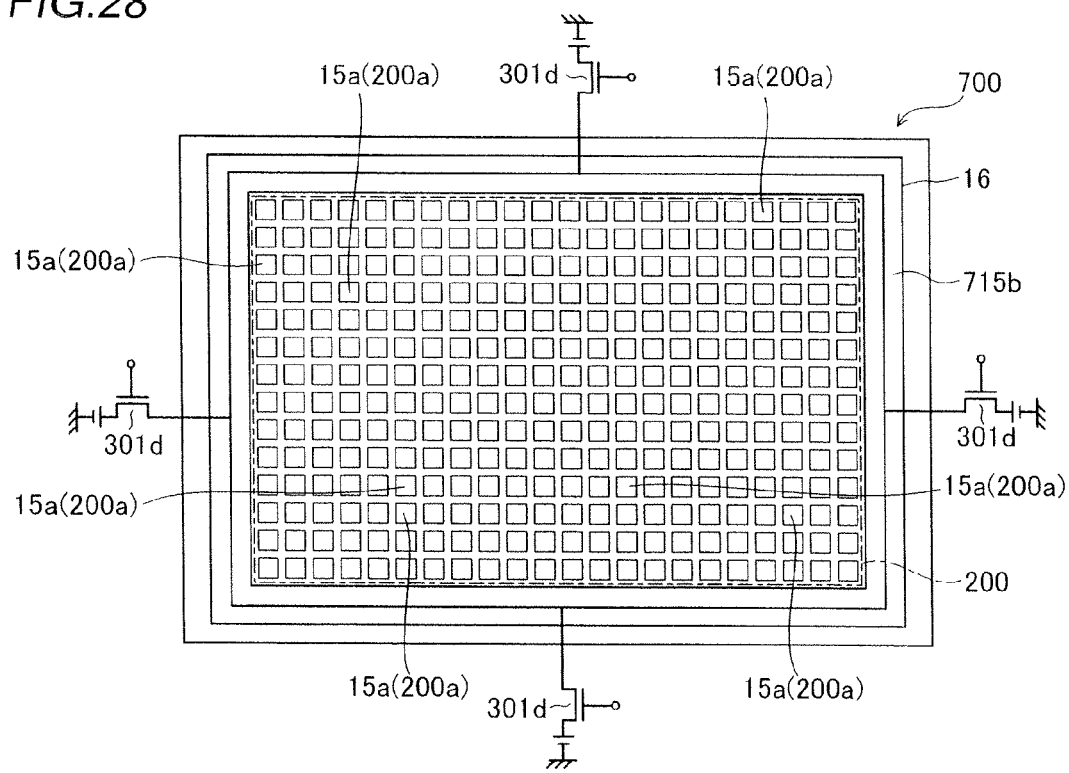
FIG. 28 is a plan view showing the overall structure of a CMOS image sensor according to a second modification of the present invention.

While the dummy electrodes 15b having the same size as the pixel electrodes 15a enclose the plurality of pixel electrodes 15a arranged in the form of a matrix in the aforementioned first embodiment, the present invention is not restricted to this but four rectangular dummy electrodes 612b extending along four sides of a pixel array region 200 may alternatively enclose a plurality of pixel electrodes 15a arranged in the form of a matrix, as in a CMOS image sensor 600 according to a first modification of the present invention shown in FIG. 27. According to the first modification, at least one charge ejection transistor 301c is electrically connected to each dummy electrode 615b. This charge ejection transistor 301c is an example of the "first transistor" in the present invention. Further alternatively, a ringlike (annular) dummy electrode 715b may enclose a plurality of pixel electrodes 15a arranged in the form of a matrix, as in a CMOS image sensor 700 according to a second modification of the present invention shown in FIG. 28. According to the second modification, at least one charge ejection transistor 301d is electrically connected to each side of the dummy electrode 715b. This charge ejection transistor 301d is an example of the "first transistor" in the present invention.

While a series of dummy electrode regions 300 are so formed as to enclose the outer periphery of the pixel array region 200 in the aforementioned first embodiment, the present invention is not restricted to this but a plurality of series of dummy electrode regions may alternatively be formed to enclose the outer periphery of a pixel array region. In this case, charge ejection transistors may be formed on the plurality of series of dummy electrode regions respectively, or the plurality of series of dummy electrode regions may be electrically connected with each other so that a common charge ejection transistor is formed for the plurality of series of dummy electrode regions.

While the gate electrodes 8a and 8b are prepared from the polysilicon film 8 in the aforementioned first embodiment, the present invention is not restricted to this but the gate electrodes 8a and 8b may alternatively be formed in multilayer structures of silicon layers and silicide layers.

Figure 29:
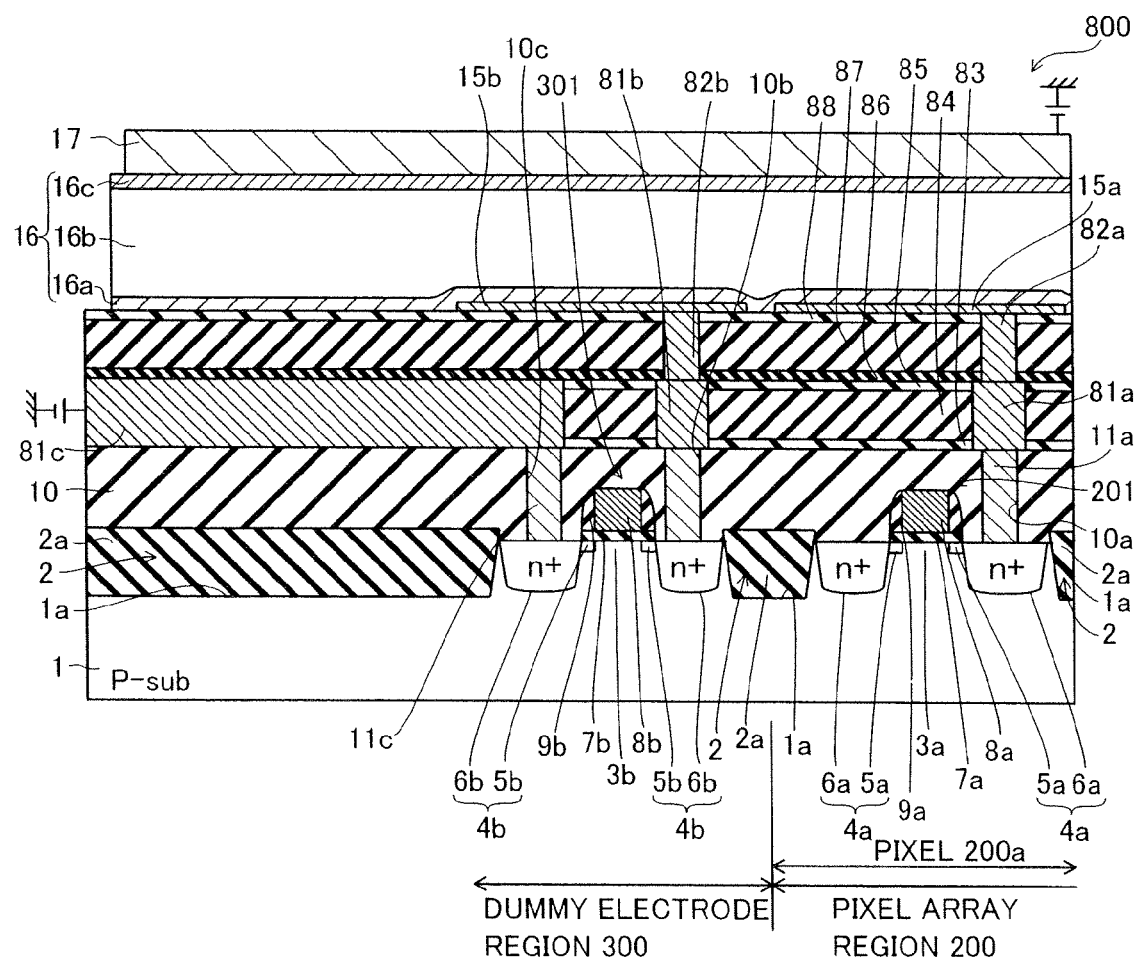
FIG. 29 is a plan view showing the overall structure of a CMOS image sensor according to a third modification of the present invention.
Figure 30:
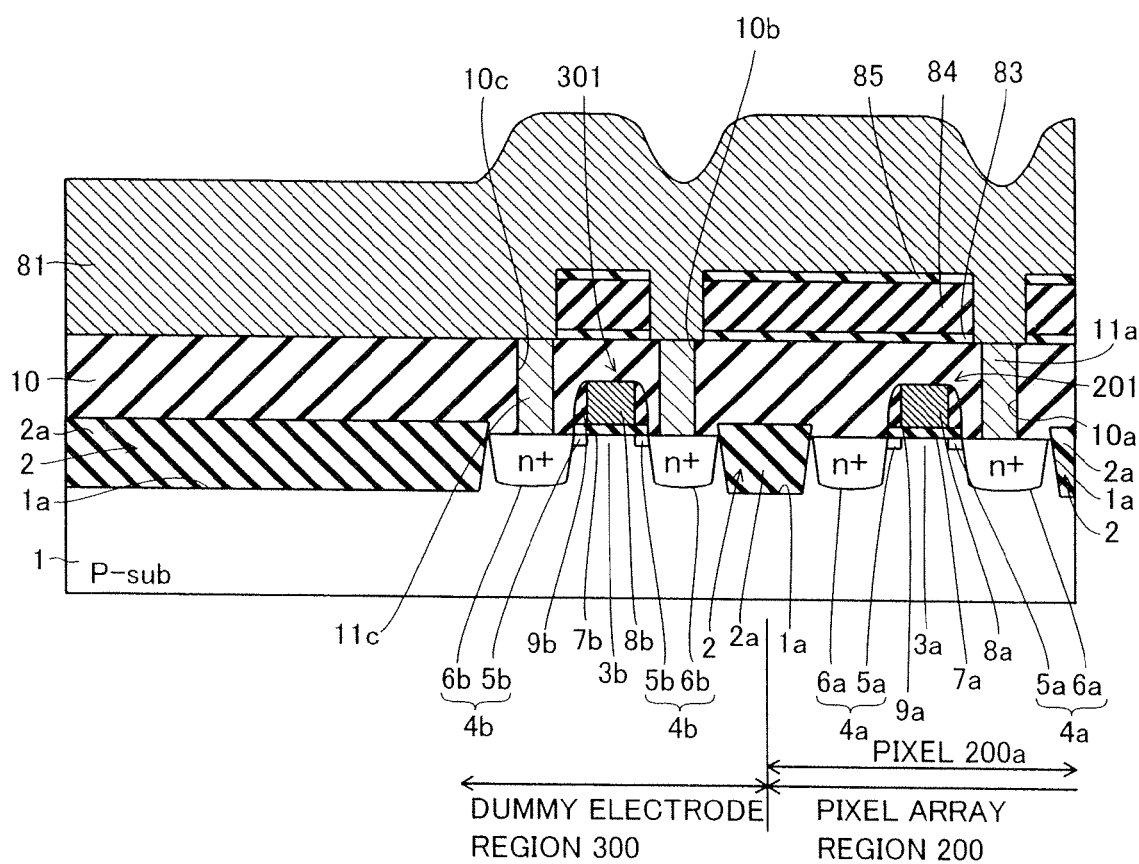
FIG. 30 is a sectional view for illustrating a CMP stopper film of the CMOS image sensor according to the third modification shown in FIG. 29.

While the CMOS image sensor 100 is provided with the interconnection layers 12a, 12b and 12c of Al or the like and the plugs 14a and 14b of tungsten in the aforementioned first embodiment, the present invention is not restricted to this but a CMOS image sensor 800 may alternatively be provided with interconnection layers 81a, 81b and 81c of Cu and plugs 82a and 82b of Cu as in a third modification of the present invention shown in FIG. 29. The CMOS image sensor 800 according to the third modification is provided with an etching stopper film 83 having a thickness of about 50 nm for serving as an etching stopper for forming the regions provided with the interconnection layers 81a, 81b and 81c, a silicon oxide film 84 having a thickness of about 300 nm, a CMP stopper film 85 having a thickness of about 50 nm, a Cu diffusion prevention film 86 having a thickness of about 50 nm, another silicon oxide film 87 having a thickness of about 300 nm and another CMP stopper film 88 having a thickness of about 50 nm in ascending order, in place of the interlayer dielectric film 13 according to the first embodiment shown in FIG. 2. The etching stopper film 83, the CMP stopper film 85, the Cu diffusion prevention film 86 and the CMP stopper film 88 are prepared from films composed of materials selected from a group consisting of SiC, SiOC, SiCN and SiON, or formed by stacking these films. The CMP stopper film 85 serves as a stopper when the interconnection layers 81a, 81b and 81c are formed by polishing a copper film 81 so formed on the upper surfaces of an interlayer dielectric film 10 and plugs 11a, 11b and 11c as to cover the etching stopper film 83, the silicon oxide film 84 and the CMP stopper film 85, as shown in FIG. 30. The CMP stopper film 88 also serves as a stopper when the plugs 82a and 82b are formed by polishing the copper film 81 by CMP.

While the source/drain regions 4a and 4b constituting the reset transistor 201 and the charge ejection transistor 301 are formed on the surface of the p-type silicon substrate 1 in the aforementioned first embodiment, the present invention is not restricted to this but a p-type well region may alternatively be formed on the surface of a silicon substrate for forming source/drain regions constituting a reset transistor and a charge ejection transistor respectively on the surface of the p-type well region.

What is claimed is:

1. An image sensor comprising:
   a plurality of pixel electrodes formed on a pixel region;
   a photoelectric conversion film arranged on said plurality of pixel electrodes;
   a dummy electrode formed in the vicinity of an end of said photoelectric conversion film for ejecting charges generated in the vicinity of said end of said photoelectric conversion film, formed in a dummy electrode region that is different from the pixel region; and
   a first transistor for controlling ejection of charges flowing into said dummy electrode.

2. The image sensor according to claim 1, wherein
   said first transistor is arranged under a region provided with said dummy electrode.

3. The image sensor according to claim 1, ejecting charges flowing into said dummy electrode by controlling said first transistor into an ON-state before an operation of reading charges from said pixel electrodes.

4. The image sensor according to claim 3, ejecting charges flowing into said dummy electrode by controlling said first transistor into an ON-state in an imaging period before said operation of reading charges.

5. The image sensor according to claim 1, wherein
   said dummy electrode is electrically connected to a first source/drain region of said first transistor while a positive potential is applied to a second source/drain region of said first transistor.

6. The image sensor according to claim 5, further comprising an interconnection layer for supplying said positive potential to said second source/drain region of said first transistor, wherein
   said interconnection layer is so provided as to extend toward said end of said photoelectric conversion film with respect to said dummy electrode.

7. The image sensor according to claim 1, wherein
   said plurality of pixel electrodes are arranged in the form of a matrix, and
   said dummy electrode is so formed as to enclose said pixel electrodes arranged in the form of a matrix.

8. The image sensor according to claim 7, wherein
   said pixel electrodes have a prescribed shape in plan view, and
   a plurality of said dummy electrodes are so formed as to have the same shape as said pixel electrodes in plan view and to enclose said pixel electrodes.

9. The image sensor according to claim 8, wherein
   said first transistor is provided every said dummy electrode.

10. The image sensor according to claim 7, wherein
    four said dummy electrodes, having a rectangular shape in plan view, are formed along sides of a pixel array region provided with said pixel electrodes arranged in the form of a matrix.

11. The image sensor according to claim 7, wherein
    one said dummy electrode is so annularly formed as to enclose said pixel electrodes arranged in the form of a matrix.

12. The image sensor according to claim 1, further comprising a second transistor connected to said pixel electrodes, wherein
    the gate electrode of said first transistor is formed by the same layer as the gate electrode of said second transistor.

13. The image sensor according to claim 1, so formed as to control the frequency for ejecting charges flowing into said dummy electrode in an imaging period.

14. The image sensor according to claim 13, so formed as to control the frequency for ejecting charges flowing into said dummy electrode in response to the quantity of charges ejected from said dummy electrode.

15. The image sensor according to claim 14, further comprising:
    a capacitor temporarily holding charges ejected from said dummy electrode, and
    a determination circuit for determining the quantity of charges held in said capacitor.

16. The image sensor according to claim 1, further comprising a transparent electrode formed on said photoelectric conversion film for receiving a negative potential.

17. The image sensor according to claim 1, further comprising a third transistor for amplifying charges flowing into said pixel electrodes.

18. The image sensor according to claim 1, so formed that the interval between said pixel electrodes and said dummy electrode is identical to the interval between said plurality of pixel electrodes.

* * * * *